(12) United States Patent
Trantham et al.

(10) Patent No.: US 11,899,590 B2
(45) Date of Patent: Feb. 13, 2024

(54) INTELLIGENT CACHE WITH READ DESTRUCTIVE MEMORY CELLS

(71) Applicant: Seagate Technology LLC, Fremont, CA (US)

(72) Inventors: Jon D. Trantham, Chanhassen, MN (US); Praveen Viraraghavan, Chicago, IL (US); John W. Dykes, Eden Prairie, MN (US); Ian J. Gilbert, Chanhassen, MN (US); Sangita Shreedharan Kalarickal, Eden Prairie, MN (US); Matthew J. Totin, Excelsior, MN (US); Mohamad El-Batal, Superior, CO (US); Darshana H. Mehta, Shakopee, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 17/844,141

(22) Filed: Jun. 20, 2022

(65) Prior Publication Data

US 2022/0405208 A1 Dec. 22, 2022

Related U.S. Application Data

(60) Provisional application No. 63/212,403, filed on Jun. 18, 2021.

(51) Int. Cl.
*G06F 12/08* (2016.01)
*G06F 12/0891* (2016.01)
*G06F 12/0895* (2016.01)
*G06F 12/1027* (2016.01)

(52) U.S. Cl.
CPC ...... *G06F 12/0891* (2013.01); *G06F 12/0895* (2013.01); *G06F 12/1027* (2013.01); *G06F 2212/60* (2013.01)

(58) Field of Classification Search
CPC ............ G06F 12/0891; G06F 12/0893; G06F 12/0895; G06F 12/0871; G06F 12/0873; G06F 12/1027; G06F 12/1045; G06F 12/0215; G06F 12/0292; G06F 2212/60; G06F 2212/1016; G06F 2212/1032; G06F 2212/222; G06F 2212/261; G06F 2212/284; G06F 2212/466; G06F 2212/507; G06F 2212/1028; G06F 2212/2024; G06F 2212/206; G06F 2212/608; G06F 2212/68;
(Continued)

(56) References Cited

U.S. PATENT DOCUMENTS 5,600,587 A 2/1997 Koike
6,711,078 B2 3/2004 Brennan et al.
7,203,084 B2 4/2007 Lee et al.
(Continued)

*Primary Examiner* — Tracy C Chan
(74) *Attorney, Agent, or Firm* — HOLZER PATEL DRENNAN

(57) ABSTRACT

A data storage system can employ a read destructive memory configured to fill a first cache with a first data set from a data repository prior to populating a second cache with a second data set describing the first data set with the first and second cache each having non-volatile ferroelectric memory cells. An entirety of the first cache may be read in response to a cache hit in the second cache with the cache hit responsive to a data read command from a host and with the first cache being read without a refresh operation restoring the data of the first cache.

20 Claims, 3 Drawing Sheets

(58) Field of Classification Search
CPC ............... G06F 13/1673; G11C 11/221; G11C 11/2273; G11C 15/046
See application file for complete search history.

(56) References Cited

U.S. PATENT DOCUMENTS

| | | | |
|---|---|---|---|
| 7,203,794 B2* | 4/2007 | Ji | G11C 11/4093 |
| | | | 711/100 |
| 7,552,255 B1* | 6/2009 | George | G06F 12/1036 |
| | | | 710/52 |
| 7,721,048 B1 | 5/2010 | Sendag et al. | |
| 8,014,186 B2 | 9/2011 | Kimura et al. | |
| 8,554,982 B2 | 10/2013 | Nishihara et al. | |
| 8,677,072 B2 | 3/2014 | Iyer et al. | |
| 8,886,880 B2 | 11/2014 | Barrell et al. | |
| 8,966,181 B2* | 2/2015 | Chen | G06F 12/0897 |
| | | | 711/140 |
| 9,202,548 B2 | 12/2015 | Faber | |
| 9,269,438 B2 | 2/2016 | Nachimuthu et al. | |
| 9,317,429 B2 | 4/2016 | Ramanujan et al. | |
| 9,740,616 B2 | 8/2017 | Busaba et al. | |
| 10,338,835 B2 | 7/2019 | Osada et al. | |
| 2003/0058681 A1 | 3/2003 | Coulson | |
| 2005/0273575 A1* | 12/2005 | Mukherjee | G06F 12/1072 |
| | | | 711/146 |
| 2006/0277367 A1 | 12/2006 | Faber | |
| 2017/0068621 A1* | 3/2017 | Watanabe | G06F 3/0679 |
| 2022/0083475 A1* | 3/2022 | Onishi | G06F 12/0833 |

* cited by examiner

INTELLIGENT CACHE WITH READ DESTRUCTIVE MEMORY CELLS

RELATED APPLICATION

The present application makes a claim of domestic priority under 35 U.S.C. 119(e) to U.S. Provisional Patent Application No. 63/212,403 filed Jun. 18, 2021, the contents of which are hereby incorporated by reference.

SUMMARY

The present disclosure is generally directed to a memory employing read destructive memory cells as an intelligent cache.

A data storage system, in some embodiments, employs a read destructive memory and is configured to fill a first cache with a first data set from a data repository prior to populating a second cache with a second data set describing the first data set with the first and second cache each having non-volatile ferroelectric memory cells. An entirety of the first cache is read in response to a cache hit in the second cache with the cache hit responsive to a data read command from a host and with the first cache being read without a refresh operation restoring the data of the first cache.

DETAILED DESCRIPTION

Figure 1:
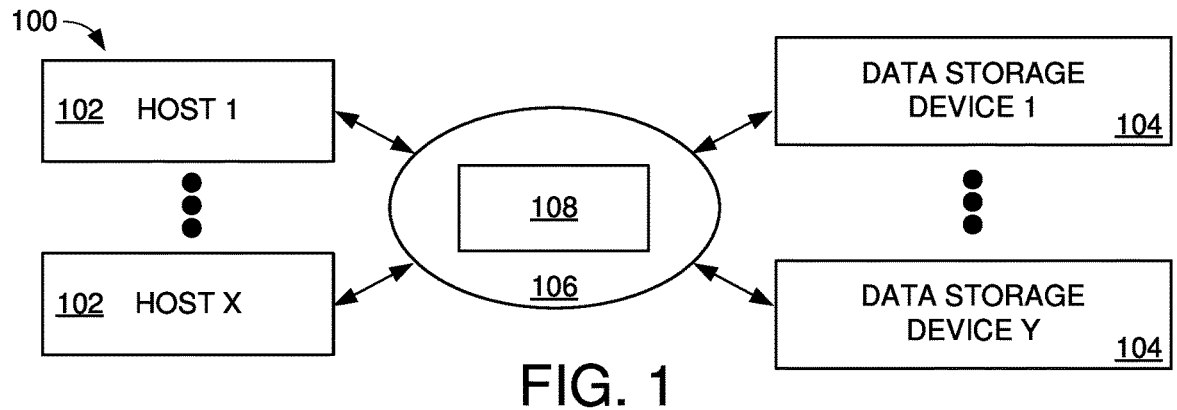
FIG. 1 provides a functional block representation of a data storage system in which various embodiments can be practiced.

Various embodiments of the present disclosure are generally directed to the intelligent use of cache constructed of read destructive memory cells as part of a data storage system.

While volatile memories, like dynamic random access memory (DRAM), have been utilized for years to provide various buffer and cache functions, the volatile nature of the memory has challenges, particularly after power loss. Non-volatile memories have been attempted for caching purposes, but have had physical and/or operational challenges. For instance, using flash memory as a cache/buffer can suffer from degradation over time and relatively slow data access times. Other non-volatile memories may be too physically large, or lack density, to provide realistic next generation cache functions.

The use of ferroelectric memory as a cache can provide fast operation and relatively small power consumption, but suffers from read destruction as sensing data corresponds with the cell losing some, or all, of the charge that stores a logical state. Such read destruction can be accommodated by simply refreshing each read cell with charge to reinstate the programmed logical state. However, refreshing cells can occupy valuable time and consume valuable power.

Generally, data storage devices can come in many forms, but all such devices usually have a top level controller and a memory. The controller manages overall operation of the device and can include one or more programmable processors and associated memory to which firmware (FW) is loaded and executed by the processor(s). The memory can take any number of forms, such as flash memory in a conventional SSD.

So-called front-end memory is often provided as part of the controller. This front-end memory can take a variety of forms (e.g., SRAM, DRAM, NOR flash, NAND flash, etc.) and serves various storage functions to support the transfers of data between the memory and an external client. In one traditional arrangement, an SSD can consist of an internal data cache formed of SRAM, which is incorporated within a system on chip (SOC) that incorporates the processors and is primarily used to cache first level map metadata describing data stored in the memory. The traditional SSD arrangement can further incorporate an external memory that is separate, but linked to, the SOC—this memory is often formed of DRAM and can be used to store the processor FW, and cached metadata (such as second level map metadata).

Another portion of the external DRAM, or another portion of volatile memory, is designated as a read buffer. This is a location to which retrieved data from the main memory are stored pending transfer to the requesting client. Finally, a separate write cache can be formed of non-volatile memory (NVM) such as NAND or NOR flash memory. The write cache serves to temporarily stored cached write data that have been received from the external client, and are awaiting transfer to the main memory. With these aspects in mind, it is noted that numerous other local memory types and locations can be utilized as well, such as local buffers, keystores, etc.

An example data storage system 100 in which assorted embodiments of an MLC memory unit and cell can be utilized in depicted as a block representation in FIG. 1. The data storage system 100 connects any number (X) of hosts 102 to any number (Y) data storage devices 104 via one or more wired and/or wireless networks 106. The various hosts 102 can be positioned in any location with any type, performance, and capability to create, transfer, and receive data stored in one or more data storage devices 104. The assorted data storage devices 104 are not limited to a uniform configuration and can have any capacity, performance capability, and type of memory to store data. It is contemplated that the respective data storage devices 104 employ non-volatile memory, such as solid-state memory cells and/or rotating magnetic media, that are employed by a network controller 108 to satisfy data access requests from one or more hosts 102.

Figure 2:
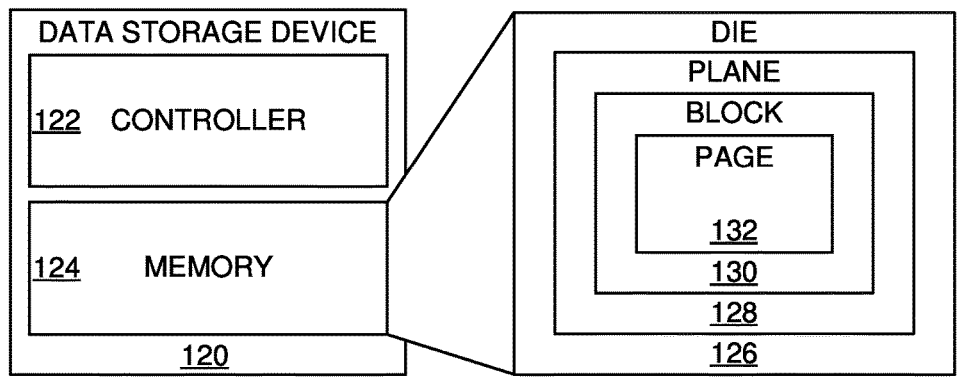
FIG. 2 depicts a block representation of portions of an example data storage device capable of being used in the data storage system of FIG. 1 in some embodiments.

FIG. 2 depicts a block representation of portions of an example data storage device 120 that may be utilized in the data storage system 100 of FIG. 1. The data storage device 120 has a local controller 122 that directs operation of one or more memories 124 to store, and retrieve, data in response to requests from one or more external hosts 102. A memory 124, in some embodiments, consists of non-volatile solid-state type of data storage cells that can be individually written or read. As shown, the assorted cells of a memory 124 can be logically and/or physically arranged into two-dimensional or three-dimensional die 126, planes 128, blocks 130, and pages 132 that are each collectively accessible at once. That is, a single die 126, plane 128, block 130, or page 132 can be read, or written, in a single instance, which provides efficient ingress and egress of data.

Figures 3A, 3B:
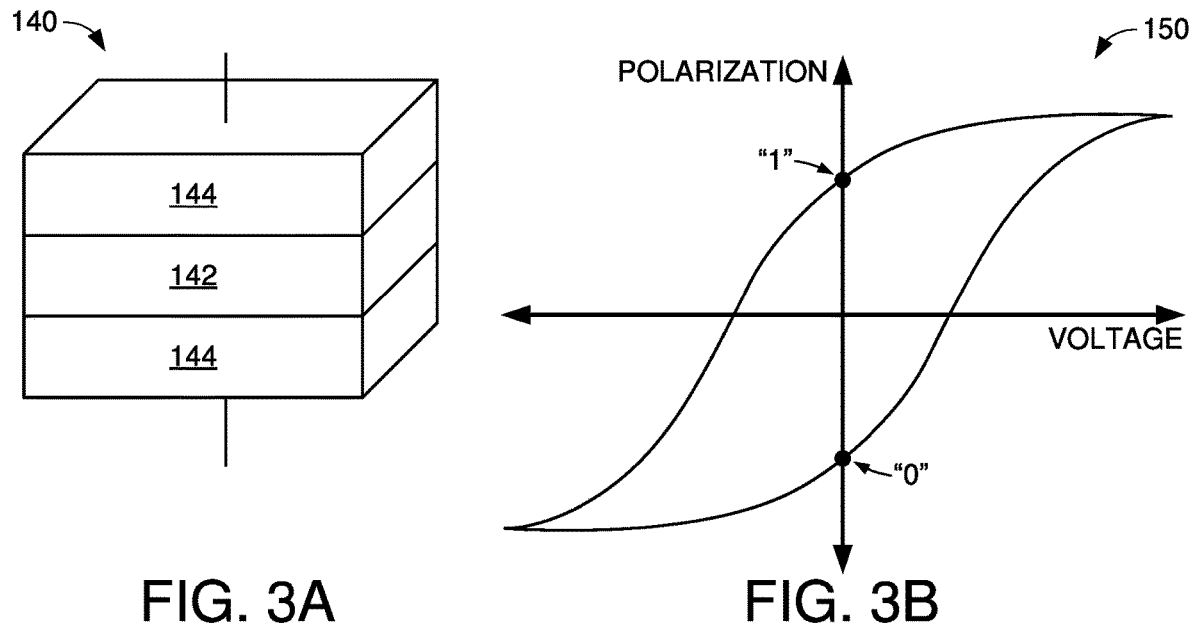
FIGS. 3A & 3B respectively shows aspects of an example memory configured in accordance with some embodiments.

FIGS. 3A and 3B respectively illustrate assorted aspects of an example solid-state memory cell 140 that may be employed in a data storage device 120 and data storage system 100 to carry out various embodiments. FIG. 3A is a block representation of a solid-state non-volatile memory cell 140 that can be used to store host-generated data. Some embodiments of the memory cell 140 are a ferroelectric memory element (FME) that uses at least one ferroelectric film 142 to facilitate stable polarizations that logically represent at least one pair of "1" and "0" states. It is contemplated that the memory cell 140 uses capacitors, transistors, multiple ferroelectric layers, and/or multiple electrodes 144, such as ferroelectric tunnel junctions and ferroelectric field effect transistors, to enable a stable polarization when programmed with a predetermined electric field. Although a single FME is shown in FIG. 3A, various embodiments interconnect multiple separate cells 140 as part of a 2D or 3D page/block/plane/die all while allowing individual FME to be accessed at one time.

FIG. 3B is an example hysteresis loop 150 for the FME 140 that illustrates how the cell 140 reacts to different applied voltages. The reliability and repeatability of the hysteresis loop 150 provides an FME 140 with the ability to be used for various types and sizes of data. In addition, the configuration of the memory cell 140 as an FME provides density capabilities, data access speeds, and power savings that are better than flash memory, exhibit greater rewriting capabilities than dynamic random access memory, and are conducive to next-generation data storage devices and systems. However, most FME 140 structural configurations are read destructive and do not retain a programmed state/polarization once accessed during a read operation. An FME memory cell 140 also can suffer from wear that alters, and potentially, degrades the ability of the cell 140 to reliably be programmed and/or read.

Figure 4A:
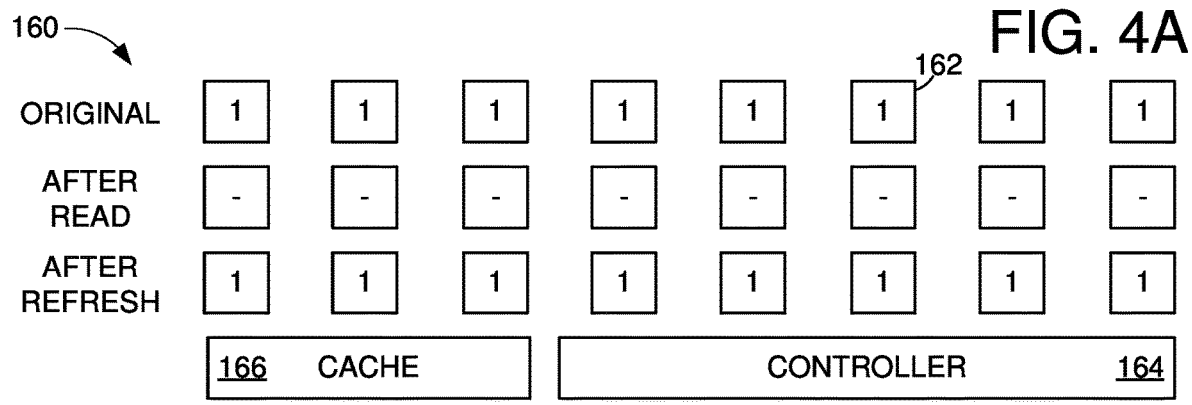
FIGS. 4A & 4B respectively depict block representations of portions of a data storage device operated in accordance with some embodiments.
Figure 4B:
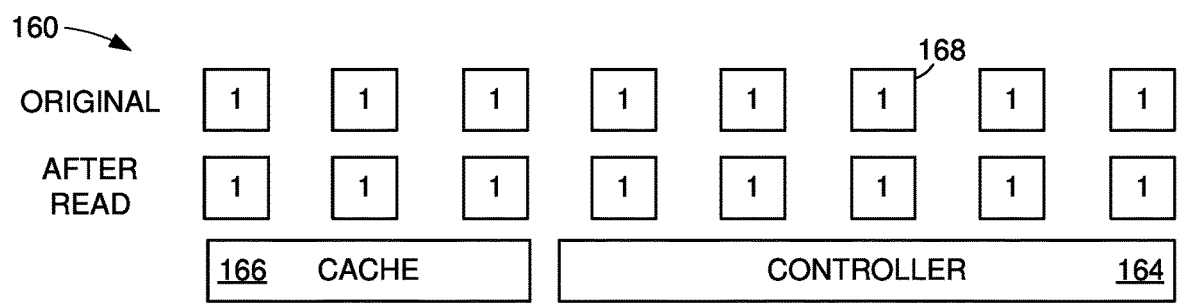

FIGS. 4A and 4B respectively depict block representations of portions of a data storage device 160 operated in accordance with some embodiments. A plurality of FME memory cells 162 are originally programmed with assorted logical states (0/1), as shown in FIG. 4A. However, the structural capabilities of the FME cells 162 cause each programmed state to be erased as the polarization of each cell 162 approaches zero, which renders each cell without a programmed state (—) that can be consistently read by any computing means.

While the originally programmed states can be read by a local, or remote, controller 164 before the respective cells 162 become unreadable, the controller 164 can be tasked with refreshing the programmed states to the respective cells 192 by conducting one or more write operations. In comparison to other, non-read destructive solid-state memory cells that can conduct a read operation without refreshing the programmed states with a write operation, FME cells 162 experience greater volumes of write operations as outputted data from a read operation is refreshed by the controller 164 from a local cache 166 or some other data storage location. Such cell writing activity can produce relatively high volumes of heat while consuming relatively large amounts of power and processing time compared to other types of memory. The addition of cell 162 health and wear being difficult to track and/or detect makes FME memory cell usage over time difficult and unreliable with current operation and management.

The read destructive cache cells 162 can be contrasted to the cache cells 168 of FIG. 4B that do not lose polarization and any programmed logic state in response to a read operation. That is, the example cache of FIG. 4B can be implemented alone, or in combination with a cache employing read destructive cells 162, with solid-state memory cells 168 constructed to retain a programmed polarization and corresponding logic state after one or more read voltages poll the cells 168 as part of a read operation. It is contemplated that the utilization of the non-read destructive cells 168 as a cache takes greater time and power than FME cells 162, even with the refresh operations that are not necessary with the non-read destructive cells 168.

It is noted that the non-read destructive cells 168 may involve refreshing over time to retain accurate polarization while programmed polarizations are not destroyed by a read operation. In other words, the non-read destructive cells 168 can require an erase operation to remove or replace a stored polarization/logic state. These challenges, along with the inefficiencies of data access and power consumption compared to read destructive cells 162, have prompted the utilization of read destructive cells 162 with the operational addition of refresh operations after a cache is wholly, or partially, read. Accordingly, various embodiments are generally focused on mitigating the operational challenges of utilizing read destructive cache cells 162 by intelligently arranging and utilizing a cache structure where a relatively small cache map describes the content of data contained in one or more relatively large cache repositories.

Figure 5:
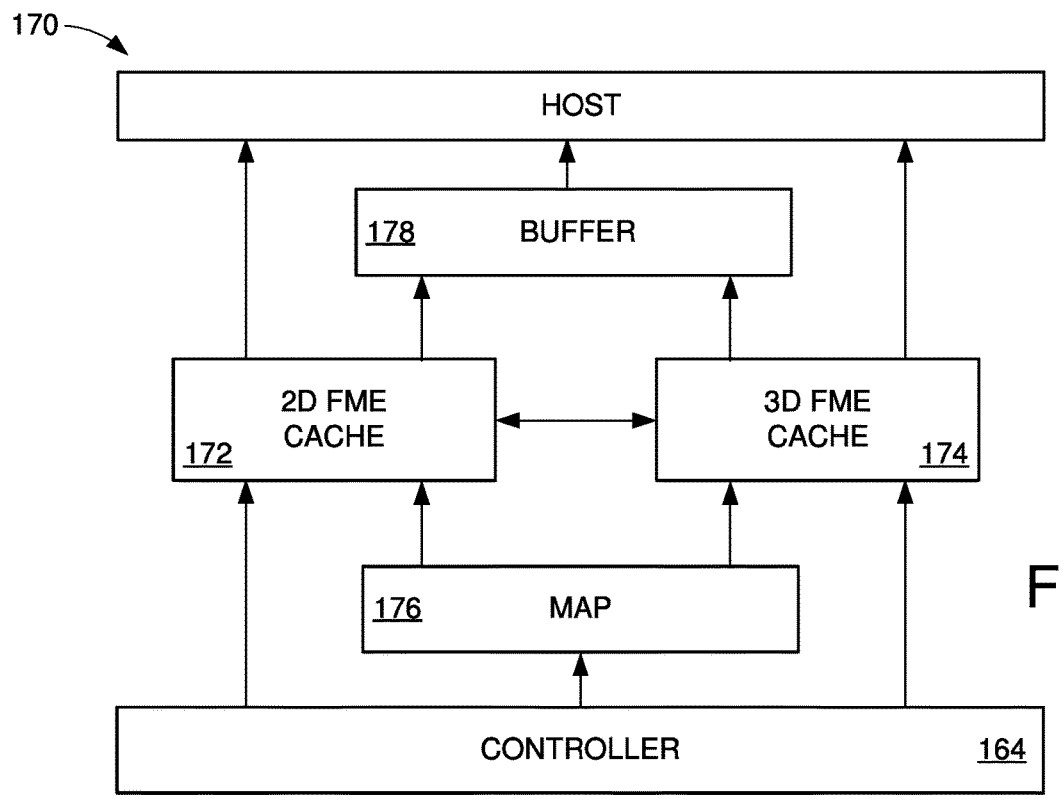
FIG. 5 depicts a block representation of portions of an example system configured to utilize read destructive memory cells as cache in accordance with some embodiments.

A block representation of a non-limiting cache arrangement is depicted in FIG. 5. The example data storage system 170 of FIG. 5 employs read destructive memory cells as a cache 172 in accordance with various embodiments to provide optimized data storage and retrieval to one or more hosts over time. It is contemplated that a cache 172 can employ read destructive FME cells in a variety of configurations, such as a two dimensional (2D) or three dimensional (3D) ferroelectric memory element (FME), that are capable of storing a single data bit at a time or storing multiple data bits concurrently. Embodiments may employ a combination of 2D cache 172 and 3D cache 174 to allow for the intelligent selection and utilization of cache based on the desired data storage performance, power, and/or reliability.

Regardless of the number, type, and size of the assorted system 170 cache, a cache map 176 can provide higher level cache correlation of logical data addresses to physical data addresses. Although not required, the cache map 176 can be configured with a smaller physical size (capacity) than the cache which it describes with physical and/or logical addresses of data requested by an upstream host. The cache map 176 may be constructed of any type of memory cells, but has read destructive FME cells in some embodiments.

The cache map 176 can be configured track the location of data, which prevents directly reading a cache 172/174 to determine if requested data is present. Hence, the cache map 176 describing the location of data in downstream cache 172/174 prevents the read destructive nature of FMEs from causing additional write operations to be conducted on the larger capacity caches 172/174 to determine the presence and location of cached data. As such, the smaller capacity cache map 176 can be read and re-written quicker and more reliably with less power consumption. It is contemplated that multiple separate cache maps 176 can be concurrently present and selectively utilized to describe the location of data in downstream cache 172/174.

It is noted that the cache arrangement of FIG. 5 can be configured and operated as a write buffer to temporarily store data that is to be written to a downstream non-volatile memory, which may be FME memory, or not. Yet, read requests can be serviced, in some embodiments, by directly accessing the respective cache 172/174 without previously polling a cache map 176. The ability to access and/or move data to a read/write buffer 178 before being sent to a requesting host allows for more efficient utilization of system 170 resources than if data was sequentially sent to a host upon demand.

With caches traditionally operating as depositories where data is read many times, the use of read destructive cells poses inefficiencies. Various embodiments use ferroelectric memory to form one or more cache/buffers for a storage device. A particularly valuable configuration is to form the write cache of ferroelectric memory (rather than flash memory as currently implemented). In some cases, the read buffer may also be formed of ferroelectric memory. In still further cases, a large ferroelectric memory may be utilized (such as a 2D or 3D structure) and portions of the memory are separately and potentially allocated for use as separate write cache and read buffer locations. It will be noted that other aspects of the local memory can also be implemented using ferroelectric memory.

The fact that a read operation will destroy the data stored in ferroelectric cells prompts various embodiments to utilize a multi-tier cache of ferroelectric cells. A top-level cache can be configured to identify what data is stored in a lower-level cache, which prevents the lower-level cache from being polled and rewritten repeatedly. The smaller size of the top-level cache corresponds with a faster and lower refresh power consumption compared to refreshing the lower-level map 176. In the event of a cache miss from the top-level, the top-level map 176 is simply refreshed. In the event of a cache hit from the top-level map 176, some, or all, of the lower-level cache 172/174 can be read to a host without a refresh operation, which results in both levels of cache being read destroyed and essentially cleared.

Figure 6:
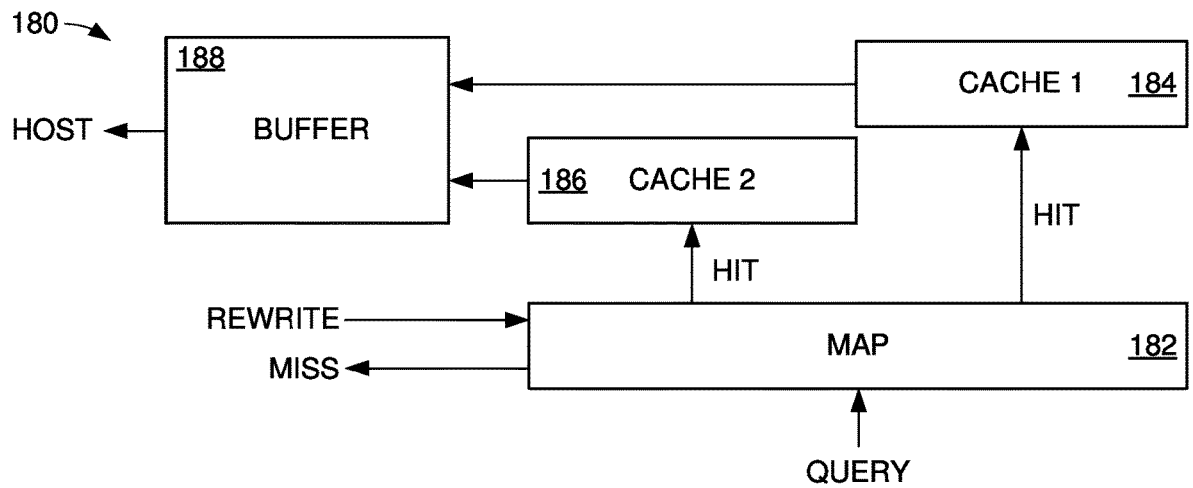
FIG. 6 illustrates a block representation of portions of an example data storage system configured and operated in accordance with assorted embodiments.

FIG. 6 depicts a block representation of portions of an example data storage system 190 configured and operated in accordance with assorted embodiments. A cache map 192 is maintained with information describing where data is stored in downstream data repositories, such as assorted caches 194/196. Polling the cache map 192 can identify if data is present in a cache 194/196 as well as the address of the queried data. With the cache map 192 consisting of read destructive FME cells, polling the cache map 192 results in clearing some, or all, of the stored information. For example, satisfying a request/query for data can result in a miss if requested data is not described by the map 192 or a hit if requested data is present in a downstream cache 194/196 and described in the map 192. Regardless of a hit or a miss to the cache map 192, a rewrite operation is necessary to populate the map 192 with information involving downstream caches 194/196.

While a host query to the cache map 192 may correspond with no retrieval of data from a cache 194/196, various embodiments respond to a host query/request to the cache map 192 with outputting data from a cache 194 to a read buffer 198. It is contemplated that data is outputted directly to a host without involving the read buffer 198, but various embodiments utilize the read buffer 198 to accumulate requested data from multiple separate caches 194/196 to promote efficiency and boost performance.

The cache map 192 may be utilized to facilitate the access and retrieval of data from multiple separate cache 194/196 concurrently, or sequentially, which allows different data to be accessed and transferred to a requesting host. With the respective cache 194/196 each constructed of read destructive solid-state memory cells, passage of a read voltage corresponds with an output of stored logic states as well as the effective erasing of all programmed data in the cache 194/196, as conveyed in FIG. 4A. It is noted that continual rewriting of data in a cache 194/196 after every read can be tedious and potentially inefficient compared to non-read destructive memories, such as NAND Flash or other random access cells. However, various embodiments utilize the consequential clearing of a cache 194/196 after a read operation to speculatively write data to a cache 194/196 that is expected to be requested in the future.

Although not required or limiting, the speculative filling of a cache 194/196 after a data read operation can move non-requested data from other data repositories to the read-destructive cache 194/196 to allow for optimal responsiveness and efficiency for future host requests to that data. Such speculative filling of a cache 194/196 will correspond with an update of the cache map 192 to reflect what data is stored in the caches 194/196. Hence, satisfaction of a read operation from one or more read-destructive caches 194/196 can result in writing of all caches 194/196 and maps 192 with preexisting and/or speculative data.

The type, size, and number of data that are speculatively written to a cache 194/196 is not limited, but can be intelligently chosen by a controller, such as controller 164, based on one or more criteria. For instance, a controller can identify trends, patterns, addresses, and/or types of data that are predicted to be requested by one or more hosts in the near future. The prediction of what speculative data to send to a cache 194/196 can involve the analysis of model information and/or logged system activity. Some embodiments configure a controller to maintain a list of data that is most ripe for speculative movement to a cache 194/196 based on predetermined criteria, such as frequency of data requests, source of data, data size, or data security level. The tracking of criteria for data can provide a nearly seamless filling of a cache 194/196 with speculative data in response to a read operation.

The ability to fill portions of a cache 194/196 with data predicted to be requested takes advantage of having a free erase operation provided by a cache read to enable optimal data access latency for the speculative data, upon host request. That is, compared to retrieving data from a non-read destructive repository or filling a cache 194/196 with data after a host request, the speculative writing of intelligently selected data to cache 194/196 can provide the lowest data access latency to satisfy a host request.

Figure 7:
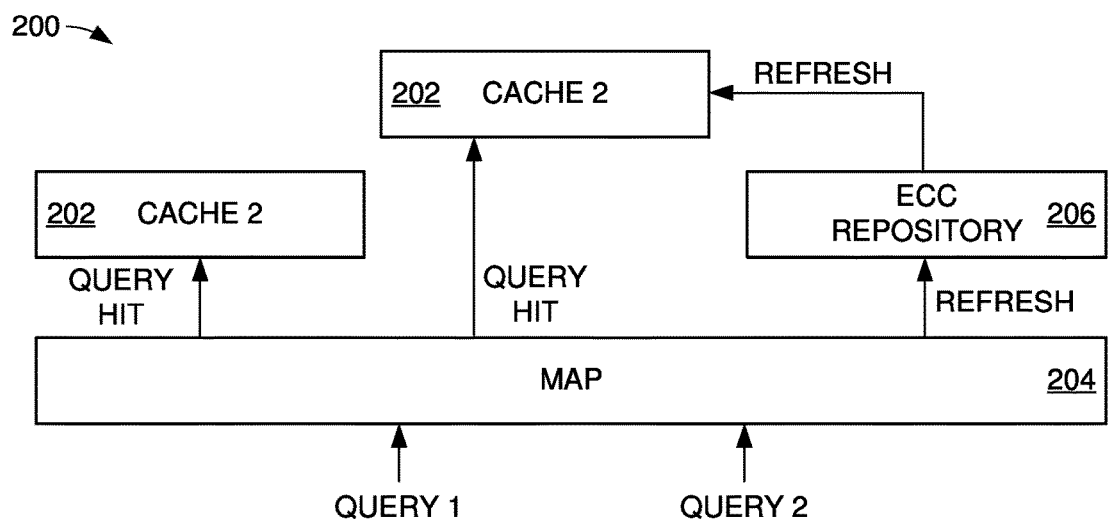
FIG. 7 illustrates a block representation of portions of an example data storage system configured and operated in accordance with assorted embodiments.

FIG. 7 depicts a block representation of portions of an example data storage system 200 that utilizes one or more cache 202 constructed with read destructive memory cells to selectively store and/or utilize error correction codes (ECC). As shown, the a top level cache map 204 can describe data stored in different read destructive caches 202 while ECC are stored in a separate repository 206, which may, or may not, be arranged of read destructive memory. It is contemplated that the ECC repository 206 can contain multiple different versions of ECC that can be selectively applied to repair different data errors and failures.

The availability of ECC can be leveraged after a cache 202 is read, and consequently cleared of stored data, to repair compromised data that is written to the cache 202. For example, a cache 202 can be filled with data that is known, or predicted, to be compromised from error, failure, or security breach, which allows ECC to be selected and applied to repair the data to make it available for transfer to host or storage in a permanent data repository of the system 200. It is noted that the availability of ECC does not require its application to data, as illustrated by the satisfaction of a host request from a first cache 202 while data of a second cache 202 is repaired with ECC. The ability to selectively utilize ECC allows the cache to be read and refreshed less, but does require the generation, or storage, of ECC when necessary.

Ferroelectric memory combines the speed advantages of DRAM with the non-volatile and stackability of flash. Ferroelectric memory is based on FMEs, or ferroelectric memory elements. FMEs can take a large variety of forms (e.g., FTJs, FeFETs, 1T1FC, 1T4FC, 2T2FCs, etc.). Regardless of configuration, an FME stores data in relation to a programmed electric polarity impressed upon an embedded ferroelectric layer. Because FMEs provide read/programming speeds in the nanosecond range, these elements provide a number of potentially valuable usages in the front end of an otherwise conventional storage device.

With speculative cache fetching and faster cache reads compared to having to refresh after each cache read, volumes of cache space can accommodate current and expected write data caching. Overall, the multi-tier cache can utilize ferroelectric memory front-end intelligently in such a way as to maintain certain QoS and data throughput performance levels for the client. Hence, embodiments are directed to both multi-tier cache and speculative caching, particularly various multi-tier cache operation for hits and misses, speculative caching of write data, variable ECC, and selectively refreshing the second (top) tier cache.

What is claimed is:

1. An apparatus comprising:
   a cache consisting of read destructive memory cells;
   a map connected to the first cache, the map consisting of read destructive memory cells storing information about data resident in the first cache; and
   a controller connected to the first cache and map, the controller configured to output less than an entirety of the data stored in the first cache in response to a map hit by a host data request, the entirety of the first cache and map subsequently filled with different data identified by the controller.

2. The apparatus of claim 1, wherein the read destructive memory cells of the cache are arranged in a two dimensional array.

3. The apparatus of claim 1, wherein the read destructive memory cells of the cache are arranged in a three dimensional array.

4. The apparatus of claim 1, wherein a read buffer is connected to the cache, the read buffer consisting of non-read destructive solid-state memory cells.

5. The apparatus of claim 1, wherein a data repository is connected to the cache, the data repository consisting of non-read destructive solid-state memory cells.

6. The apparatus of claim 1, further comprising a second cache connected to the map and first cache, the second cache consisting of read destructive memory cells, data stored in the second cache described by the map.

7. The apparatus of claim 6, wherein the second cache has a different capacity than the first cache.

8. The apparatus of claim 1, wherein the read destructive memory cells are non-volatile ferroelectric solid-state cells.

9. A method comprising:
   filling a cache with a first data set from a data repository;
   populating a cache map with a second data set describing the first data set, the cache and cache map each comprising read destructive memory cells;
   reading an entirety of the cache in response to a cache hit to the cache map by a host request, the cache read without a refresh operation restoring the data of the cache, and
   filling the cache with data predicted by a controller to be requested by a host in the future.

10. The method of claim 9, wherein the controller maintains a list of data to speculatively fill the cache in response to satisfaction of the host request.

11. The method of claim 10, wherein the list of data is populated based on frequency of data accesses over time.

12. The method of claim 10, wherein the list of data is populated based on a source of data.

13. The method of claim 10, wherein the list of data is populated based on a timestamp of when data is written to the data repository.

14. The method of claim 10, wherein the list of data is populated based on size.

15. The method of claim 9, wherein the cache map is rewritten in response to cache miss by a data request from a host.

16. The method of claim 9, wherein the data predicted by the controller fills the cache without an existing request from a host.

17. A method comprising:
   filling a cache with a first data set from a data repository;
   populating a cache map with a second data set describing the first data set, the cache and cache map each comprising read destructive memory cells;
   reading an entirety of the cache in response to a cache hit to the cache map by a host request, the cache read without a refresh operation restoring the data of the cache,
   filling the cache with data identified by a controller as compromised; and
   applying an error correction code to the data identified as compromised while the data is resident in the cache.

18. The method of claim 17, wherein a memory stores multiple different versions of error correction code for selection by the controller.

19. The method of claim 18, wherein the controller selects a version of error correction based on availability of processing resources.

20. The method of claim 17, wherein the compromised data has experienced an error and cannot be accurately read by the controller.

* * * * *